United States Patent [19]

Fujioka et al.

[11] Patent Number: 5,668,763
[45] Date of Patent: Sep. 16, 1997

[54] SEMICONDUCTOR MEMORY FOR INCREASING THE NUMBER OF HALF GOOD MEMORIES BY SELECTING AND USING GOOD MEMORY BLOCKS

[75] Inventors: Shinya Fujioka; Atsushi Hatakeyama; Hirohiko Mochizuki, all of Kawasaki, Japan

[73] Assignee: Fujitsu Limited, Kawasaki, Japan

[21] Appl. No.: 606,819

[22] Filed: Feb. 26, 1996

[51] Int. Cl.$^6$ .................................................. G11C 29/00
[52] U.S. Cl. ................. 365/200; 365/225.7; 365/230.03
[58] Field of Search ........................... 365/200, 225.7, 365/230.03, 201, 230.06, 230.08

[56] References Cited

U.S. PATENT DOCUMENTS

| | | | |
|---|---|---|---|
| 4,066,880 | 1/1978 | Salley | 365/200 |
| 4,365,318 | 12/1982 | Aichelmann, Jr. et al. | 365/200 |
| 4,475,194 | 10/1984 | LaVallee et al. | 365/200 |
| 4,992,984 | 2/1991 | Busch et al. | 365/200 |
| 5,051,994 | 9/1991 | Bluethman et al. | 365/200 |
| 5,070,502 | 12/1991 | Supnik | 365/200 |
| 5,126,973 | 6/1992 | Gallia et al. | 365/230.03 |
| 5,134,584 | 7/1992 | Boler et al. | 365/200 |
| 5,214,657 | 5/1993 | Farnworth et al. | 365/200 |
| 5,243,570 | 9/1993 | Saruwatari | 365/230.03 |
| 5,278,793 | 1/1994 | Yeh | 365/200 |
| 5,377,148 | 12/1994 | Rajsuman | 365/201 |
| 5,402,376 | 3/1995 | Horiguchi et al. | 365/200 |
| 5,465,234 | 11/1995 | Hannai | 365/200 |
| 5,471,431 | 11/1995 | McClure | 365/230.03 |
| 5,563,832 | 10/1996 | Kagami | 365/200 |

*Primary Examiner*—Tan T. Nguyen
*Attorney, Agent, or Firm*—Staas & Halsey

[57] ABSTRACT

A semiconductor memory has a plurality of memory arrays, and a plurality of selection circuits. Each of the memory arrays has a plurality of memory blocks. The selection circuits is provided to the memory arrays and is used to independently disable a defective memory block and select a normal memory block in the memory array. Therefore, the semiconductor memory enables to increase the number of partial good memories (half good memories: half capacity memory), and to increase a product yield.

17 Claims, 8 Drawing Sheets

|  | ⌀1 | ⌀2 | ⌀3 |
|---|---|---|---|
| NORMAL | $V_{SS}$ | $V_{CC}$ | $V_{SS}$ |
| RA12'=$V_{CC}$ | $V_{CC}$ | $V_{SS}$ | $V_{SS}$ |
| RA12'=$V_{SS}$ | $V_{CC}$ | $V_{CC}$ | $V_{CC}$ |

|  | f1 | φ2 | φ3 |
|---|---|---|---|
| NORMAL | ○ | $V_{CC}$ | $V_{SS}$ |
| RA12'=$V_{CC}$ | × | $V_{SS}$ | $V_{SS}$ |
| RA12'=$V_{SS}$ | × | $V_{CC}$ | $V_{CC}$ |

SEMICONDUCTOR MEMORY FOR INCREASING THE NUMBER OF HALF GOOD MEMORIES BY SELECTING AND USING GOOD MEMORY BLOCKS

BACKGROUND OF THE INVENTION

1. Field of the Invention

The present invention relates to a semiconductor memory, and more particularly, to a semiconductor memory having a memory cell portion constituted by a plurality of memory arrays.

2. Description of the Related Art

Recently, semiconductor memories (for example, dynamic random access memories: DRAMs) have been strongly required to be highly integrated. Namely, a size of a transistor (memory cell) included in the DRAMs must be minimized and a gate oxide film of the transistor (MOS transistor) must also be thin.

By the way, recently, in semiconductor memory devices, a plurality of redundant memory cells are previously provided (manufactured), and defective memory cells (which may be caused in the manufacturing processes, and the like) are replaced by the redundant memory cells, so that a semiconductor memory having defective memory cells can be sold as a complete (fully operational) semiconductor memory.

However, when the number of the defective memory cells included in the semiconductor memory is larger than that of the redundant memory cells provided in the semiconductor memory, all of the defective memory cells cannot be replaced by the redundant memory cells, and the semiconductor memory cannot be sold as a complete operational semiconductor memory, but this semiconductor memory must be scrapped as a defective semiconductor memory.

In recent years, there has been studied and proposed a semiconductor memory having a memory cell portion (constituted by a plurality of memory arrays) which is divided into to two blocks, and when all half blocks of the memory arrays (half block of the memory cell portion) are normal (completely accessible), even though the number of the defective memory cells included in the semiconductor memory is larger than that of the redundant memory cells provided in the semiconductor memory, the semiconductor memory can be sold as a half good memory (or half capacity memory).

However, when all defective blocks of the memory cell portion of the semiconductor memory do not exist on one (one side) of the two memory blocks (which constitute each memory array of the memory cell portion), the semiconductor memory can not be sold as a half good memory (partial good memory), but is scrapped as a defective semiconductor memory.

The problems of the prior art will be explained hereinafter in detail with reference to the accompanying drawings.

SUMMARY OF THE INVENTION

An object of the present invention is to provide a semiconductor memory able to increase the number of partial good memories (half good memories), and to increase a product yield (including the partial good memories).

According to the present invention, there is provided a semiconductor memory for selectively constituting a complete memory or a partial good memory, comprising a plurality of memory arrays each including a plurality of memory blocks; and a plurality of selection circuits, provided to the respective memory arrays, for independently disabling a defective memory block and selecting a normal memory block in the memory array.

Each of the selection circuits may be provided to respective one of the memory arrays. Further, each of the selection circuits may be provided to respective neighbouring two of the memory arrays.

Each of the memory arrays may comprise a first memory block and a second memory block, and the selection circuit may disable the first memory block and select the second memory block, when the first memory block is defective and the second memory block is normal. Each memory block in the respective memory array may comprise a plurality of word lines, a plurality of bit lines, and a plurality of memory cells each provided at a crossing portion of the word line and the bit line, and the word lines of each memory block may be the same. The selection circuit may disable the defective memory block and select the normal memory block in accordance with specific signals.

The selection circuit may comprises a first switching unit for selectively constituting a complete memory or a partial good memory; a second switching unit for selecting a specific memory block in the memory array in accordance with a second control signal, when modifying the semiconductor memory as the partial good memory; and a third switching unit for selecting another specific memory block in the memory array in accordance with a third control signal, when modifying the semiconductor memory as the partial good memory.

The first switching unit may cut a specific address signal in accordance with a first control signal, and an output of the selection circuit may be determined in accordance with switching states of the second and third switching units. The first switching unit may comprise a fuse for cutting a specific address signal by melting the fuse, and an output of the selection circuit may be determined in accordance with switching states of the second and third switching units.

Further, according to the present invention, there is also provided a semiconductor memory for selectively constituting a complete memory or a half good memory, comprising a plurality of memory arrays each including a first memory block and a second memory block; and a plurality of selection circuits, each provided to the respective memory arrays, for independently disabling the first memory block and selecting the second memory block, when the first memory block is defective and the second memory block is normal.

Each of the first and second memory blocks may comprise a plurality of word lines, a plurality of bit lines, and a plurality of memory cells each provided at a crossing portion of the word line and the bit line, and the word lines of the first memory block may be the same as that of the second memory block.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the present invention, the problems in a semiconductor memory according to the prior art will be explained with reference to FIGS. 1 and 2.

Figure 1:
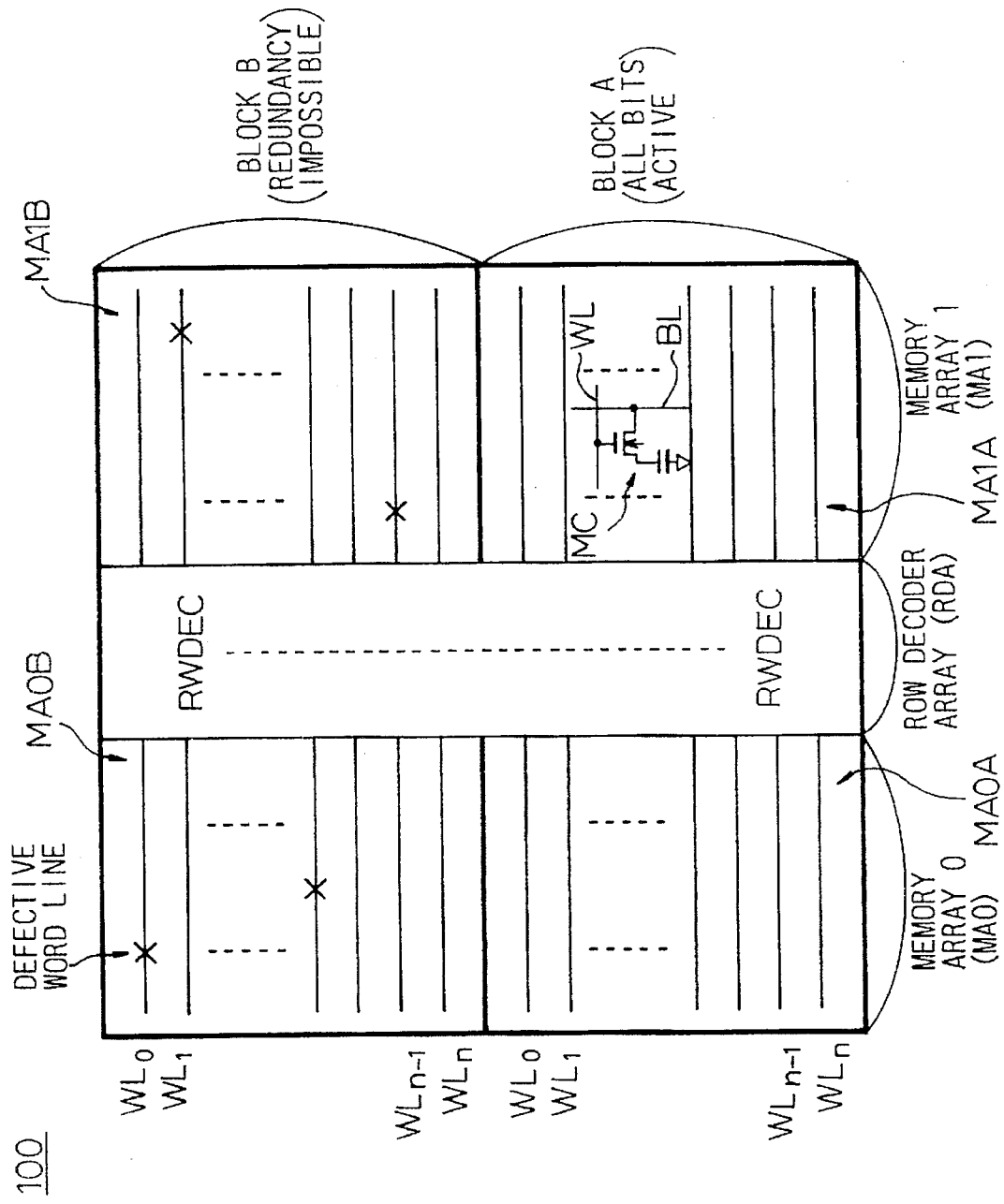
FIG. 1 is a block diagram showing an example of a memory cell portion having defective word lines in a semiconductor memory according to the prior art.

FIG. 1 shows an example of a memory cell portion having defective word lines in a semiconductor memory (DRAM) according to the prior art. In FIG. 1, reference 100 denotes a memory cell portion, WL (WL$_0$ to WLn) denotes a word line, BL denotes a bit line, MC denotes a memory cell, RDA denotes a row decoder array, and MA0 and MA1 denote memory arrays.

As shown in FIG. 1, each memory array MA0 and MA1 is constituted by two blocks A and B (MA0A, MA1A and MA0B, MA1B) and each memory block MA0A and MA0B (MA1A and MA1B) in the memory array MA0 (MA1) comprises a plurality of word lines WL$_0$ to WLn (WL), a plurality of bit lines (BL), and a plurality of memory cells (MC) each provided at a crossing portion of the word line WL and the bit line BL. Note that, the word lines WL$_0$ to WLn of the memory block MA0A (MA1A) are the same as that of the memory block MA0B (MA1B).

As shown in FIG. 1, in the memory cell portion 100, some lines are defective, and these defective word lines are only included in the block B (MA0B, MA1B).

In the semiconductor memory (memory cell portion) shown in FIG. 1, a redundancy processing for the block B (MA0B and MA1B) cannot be carried out, since the number of the defective memory cells connected to the defective word lines in the semiconductor memory is larger than that of redundant memory cells (not shown in the drawing) provided in the semiconductor memory. However, all word lines (WL$_0$ to WLn) included in the block A (MA0A and MA1A) are normal (not defective), and all bits (all memory cells) of the block A (MA0A, MA1A) can be accessed. Therefore, in this case, the defective block B (MA0B, MA1B) is disabled (killed) and the complete block A (MA0A, MA1A) is enabled by only fixing a specific control signal (specific address signal) at a power supply voltage (Vcc or Vss).

Namely, in the semiconductor memory shown in FIG. 1, the memory cell portion having a plurality of memory arrays (MA0, MA1) is divided into two blocks (MA0A, MA1A; MA0B, MA1B), and when half blocks (MA0A, MA1A) of the memory cell portion 100 are completely operable (normal), even though the other half blocks (MA0B, MA1B) thereof are defective, the semiconductor memory can be modified and sold as a half good memory (partial good memory). Concretely, when a total memory capacity of a semiconductor memory is 64 Mbits, the semiconductor memory can be sold as a 32 Mbits semiconductor memory, and when a total memory capacity of a semiconductor memory is 256 Mbits, the semiconductor memory can be sold as a 128 Mbits semiconductor memory.

Figure 2:
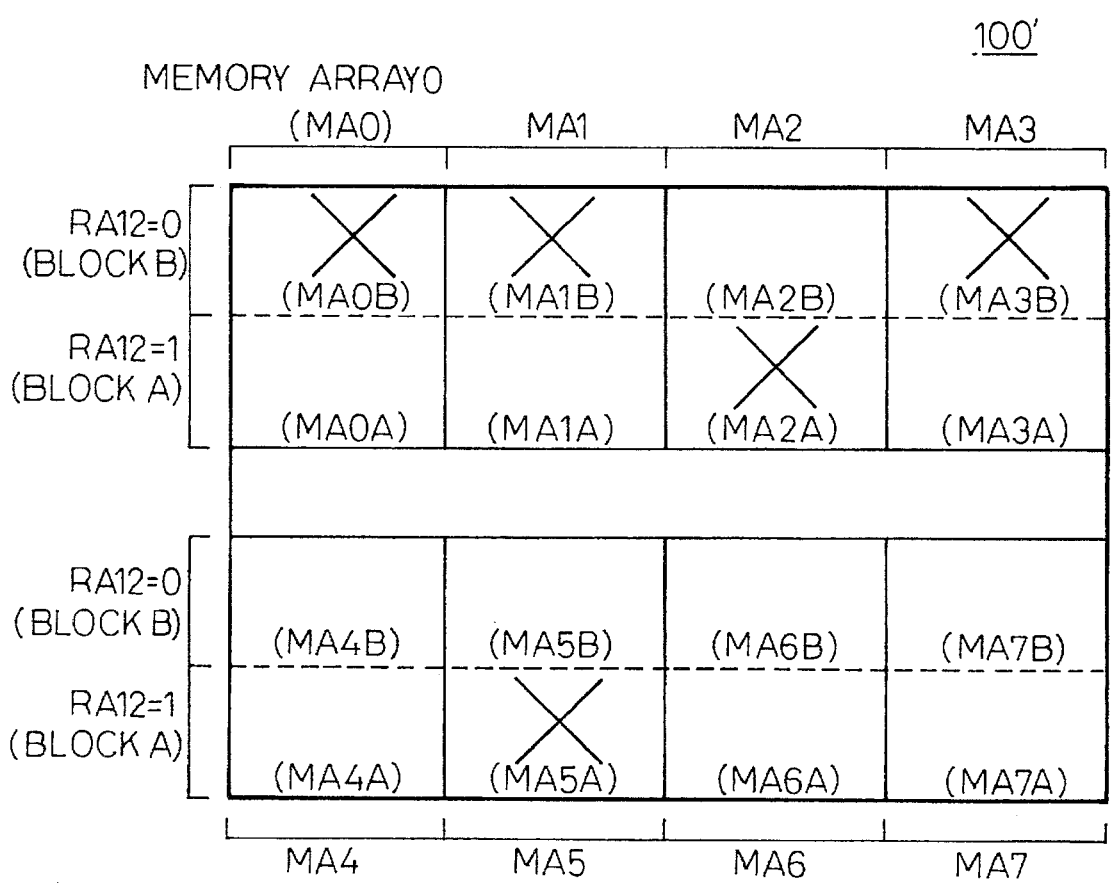
FIG. 2 is a block diagram showing another example of a memory cell portion having some defective memory blocks in a semiconductor memory according to the prior art.

FIG. 2 shows another example of a memory cell portion having some defective memory blocks in a semiconductor memory according to the prior art.

As shown in FIG. 2, the memory cell portion 100' is constituted by a plurality of memory arrays MA0 to MA7, and each memory array (MA0 to MA7) is constituted by two blocks A and B (MA0A to MA7A and MA0B to MA7B), similar to the semiconductor memory (memory cell portion) shown in FIG. 1. In the memory cell portion 100' shown in FIG. 2, some memory blocks MA0B, MA1B, MA2A, MA3B, and MA5A are defective, wherein at least one of the two blocks (A, B) in each memory array (MA0 to MA7) can be accessed (normal). In this case, the prior art semiconductor memory shown in FIG. 2 cannot be modified or sold as a half good memory, since the defective blocks exist on both blocks A and B of the memory cell portion 100'.

Namely, the defective memory blocks MA2A and MA5A are included in the memory block A of the memory cell portion 100', and the defective memory blocks MA0B, MA1B, and MA3B are included in the memory block B of the memory cell portion 100'. Note that the memory blocks A (MA0A to MA7A) are simultaneously selected (or disabled), and similarly, the memory blocks B (MA0B to MA7B) are also simultaneously selected. Therefore, the semiconductor memory having the memory cell portion shown 100' in FIG. 2 cannot be modified or sold as a half good memory, but is scrapped as a defective semiconductor memory.

Next, the preferred embodiments of a semiconductor memory according to the present invention will be explained, with reference to the accompanying drawings.

Figure 3A:
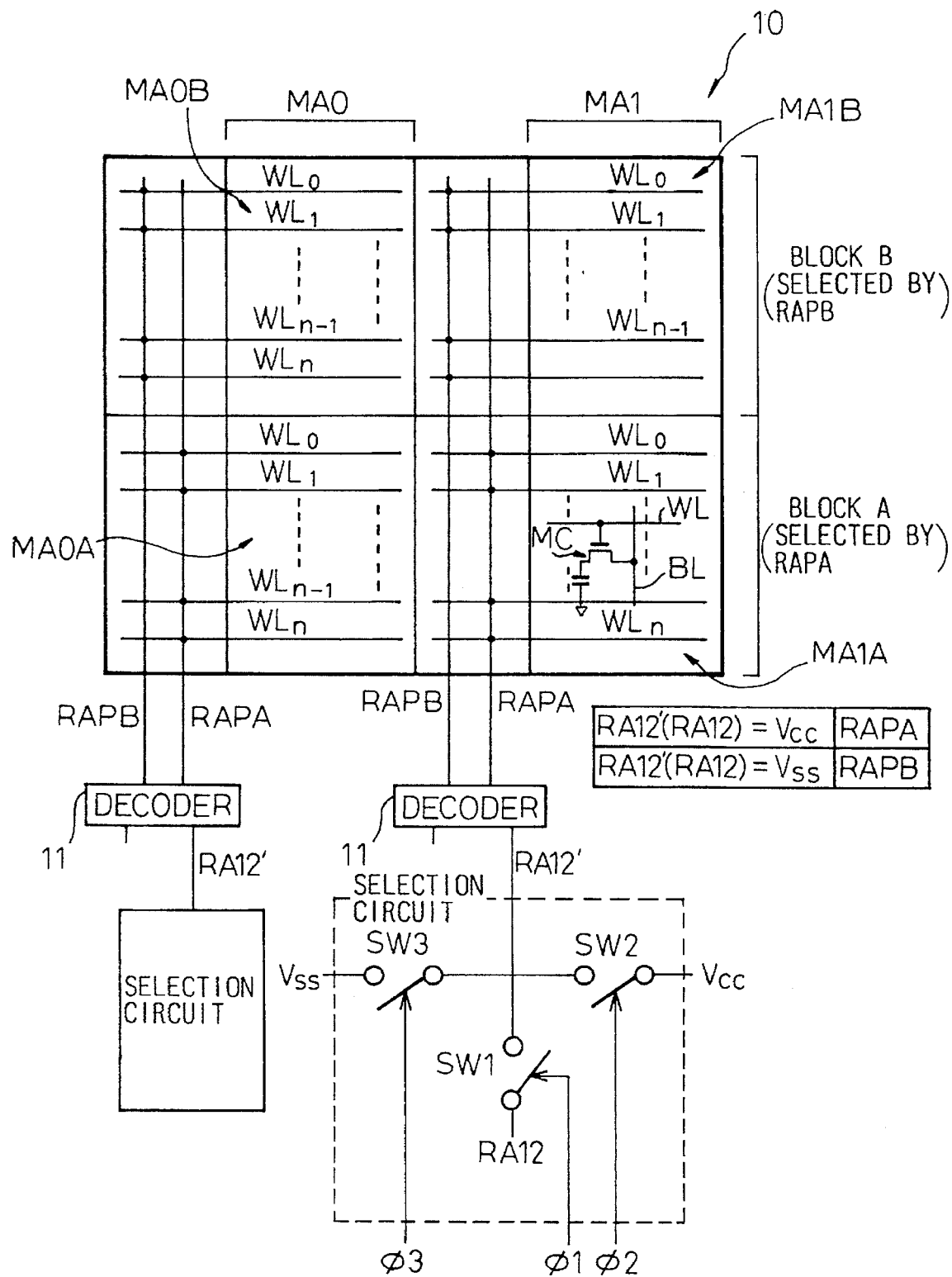
FIG. 3A is a block diagram for explaining an embodiment of a semiconductor memory according to the present invention.

FIG. 3A is a block diagram for explaining an embodiment of a semiconductor memory according to the present invention.

In FIG. 3A, reference 10 denotes a memory cell portion, WL (WL$_0$ to WLn) denotes a word line, BL denotes a bit line, MC denotes a memory cell, RDA denotes row decoder array, and MA0 and MA1 denote memory arrays. Further, reference 11 denotes a decoder, SW1 to SW3 denote switching units, Vcc denotes a high potential power supply voltage, and Vss denotes a low potential power supply voltage.

As shown in FIG. 3A, each memory array MA0 and MA1 is constituted by two blocks A and B (MA01, MA1A and MA0B, MA1B), and the same word lines WL$_0$ to WLn are arranged in the block A (blocks MA0A and MA1A) and the block B (blocks MA0B and MA1B). Further, each memory block MA0A and MA0B (MA1A and MA1B) in the memory array MA0 (MA1) comprises a plurality of word lines WL$_0$ to WLn (WL), a plurality of bit lines (BL), and a plurality of memory cells (MC) each provided at a corresponding crossing portion of a respective line WL and a respective bit line BL. Note that respective selection circuits, each having corresponding switching units (SW1 to SW3) are provided for the memory arrays MA0 and MA1 and, in each memory array MA0 and MA1, the memory blocks MA0A, MA1A and MA0B, MA1B can be independently selected.

In the semiconductor memory, a process for constituting a half good memory is selected (or carried out) by specific signals (control signals φ 1, φ 2, φ 3), and in each memory array (MA0; MA1), the memory block A or B (MA0A, MA1A; MA0B, MA1B) is independently selected by specific signal [RA12' (RA12)=Vcc, Vss].

Namely, in the semiconductor memory shown in FIG. 3A, when the memory cell portion 10 has no defective block, or when all defective memory cells of the memory cell portion 10 are replaced by the redundant memory cells which are manufactured in the semiconductor memory (when the semiconductor memory is a complete memory), the switching unit SW1 is switched ON (closed), the switching units SW2 and SW3 are switched OFF (opened), and the blocks A and B (memory blocks MA0A, MA1A; MA0B, MA1B) are selected in accordance with a signal (address signal) RA12.

On the other hand, when the memory cell portion 10 has at least one defective block and all defective memory cells of the memory cell portion 10 cannot be replaced by the redundant memory cells, that is, when modifying (constituting) the semiconductor memory as a half good memory (partial good memory) constituted by the block A (memory blocks MA0A and MA1A), the switching unit SW1 is switched OFF (opened), the switching units SW2 is switched ON (closed) and the switching units SW3 is switched OFF (opened), so that the signal (address signal) RA12' is fixed at the high potential power supply voltage Vcc. In this case, when modifying the semiconductor memory as a half good memory constituted by the block B (memory blocks MA0B and MA1B) instead of the block A, the switching unit SW1 is switched OFF (opened), the switching units SW2 is switched OFF (opened) and the switching units SW3 is switched ON (closed), so that the signal (address signal) RA12' is fixed at the low potential power supply voltage Vss.

Note that the signal RA12 is an address signal for selecting (accessing) one memory block from the two memory memory blocks (MA0A, MA1A; MA0B, MA1B) in the complete memory. Therefore, when modifying the semiconductor memory as a half good memory instead of the complete memory, the address signal RA12 is not necessary for selectively accessing the two memory blocks, but the the signal RA12' (RA12) is used to select (disable) one of the two memory blocks by fixing the level of the signal RA12' at the low or high power supply voltage Vss or Vcc. In FIG. 3A, output signals (RA12') of the selection circuits for memory arrays MA0 and MA1 are described as the same reference (RA12'), but these signals are independently determined to defect (disable) a defective block and to select (enable) a normal block, respectively.

Namely, as shown in FIG. 3A, when the signal RA12 (RA12') is at the high potential power supply voltage Vcc, the decoder 11 selects the block A (MA0A, MA1A) by a wiring (signal) RAPA, conversely, when the signal RA12 (RA12') is at the low potential power supply voltage Vss, the decoder 11 selects the block B (MA0B, MA1B) by a wiring (signal) RAPB. As described above, the selection circuit having the switching units SW1 to SW3 is provided to each memory array MA0 and MA1, respectively, and in each memory array MA0 and MA1, the memory blocks MA0A, MA1A; MA0B, MA1B can be independently selected. Further, in this case, the address signal corresponding to the signal (external address signal) RA12 is disabled (or ignored).

Figure 3B:
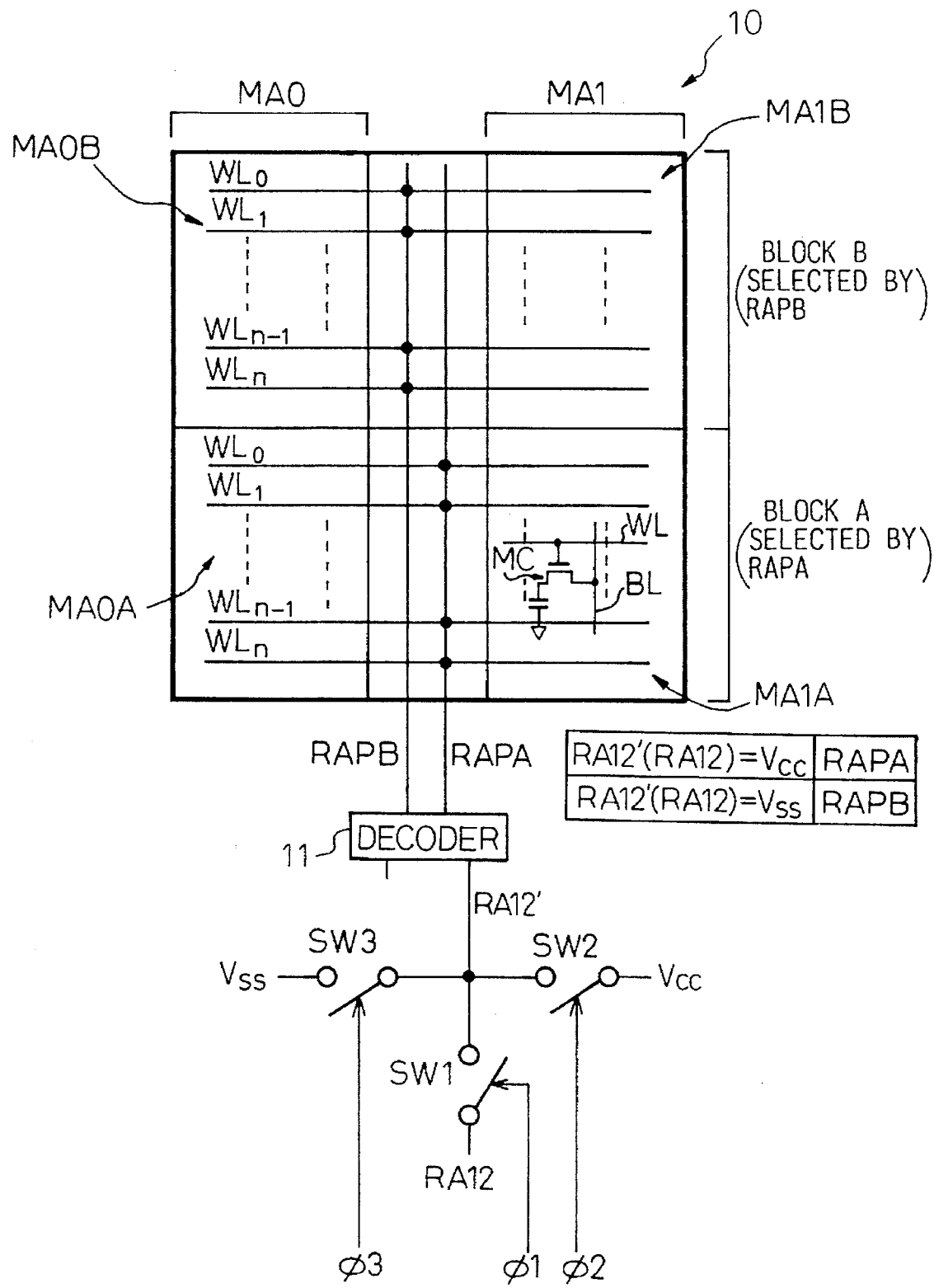
FIG. 3B is a block diagram for explaining another embodiment of a semiconductor memory according to the present invention.

FIG. 3B is a block diagram for explaining another embodiment of a semiconductor memory according to the present invention.

By comparing the memory cell portion (10) of FIG. 3B with that of FIG. 3A, in the memory cell portion 10 of FIG. 3A, one selection circuit is provided to each (one) memory array MA0, MA1 (MA2, MA3, MA4, . . . ). On the other hand, in the memory cell portion 10 of FIG. 3B, one selection circuit is provided to respective neighbouring two memory arrays MA0, MA1 (MA2, MA3; MA4, MA5; . . . ).

In this embodiment shown in FIG. 3B, the number of the selection circuits can be decreased (halved). However, in the embodiment of FIG. 3B, the same memory blocks A or B are simultaneously selected, and thus when different memory blocks (memory block A or B) in the neighbouring two memory arrays (to which the same selection circuit is provided) are defective, the semiconductor memory cannot be constituted (modified) as a half good memory. Namely, when the memory block MA0B of the memory array MA0 and the memory block MA1B of the memory array MA1 are defective, the semiconductor memory can be constituted as a half good memory, but when the memory block MA0B of the memory array MA0 and the memory block MA1A of the memory array MA1 are defective, the semiconductor memory cannot be constituted as a half good memory.

Figure 4:
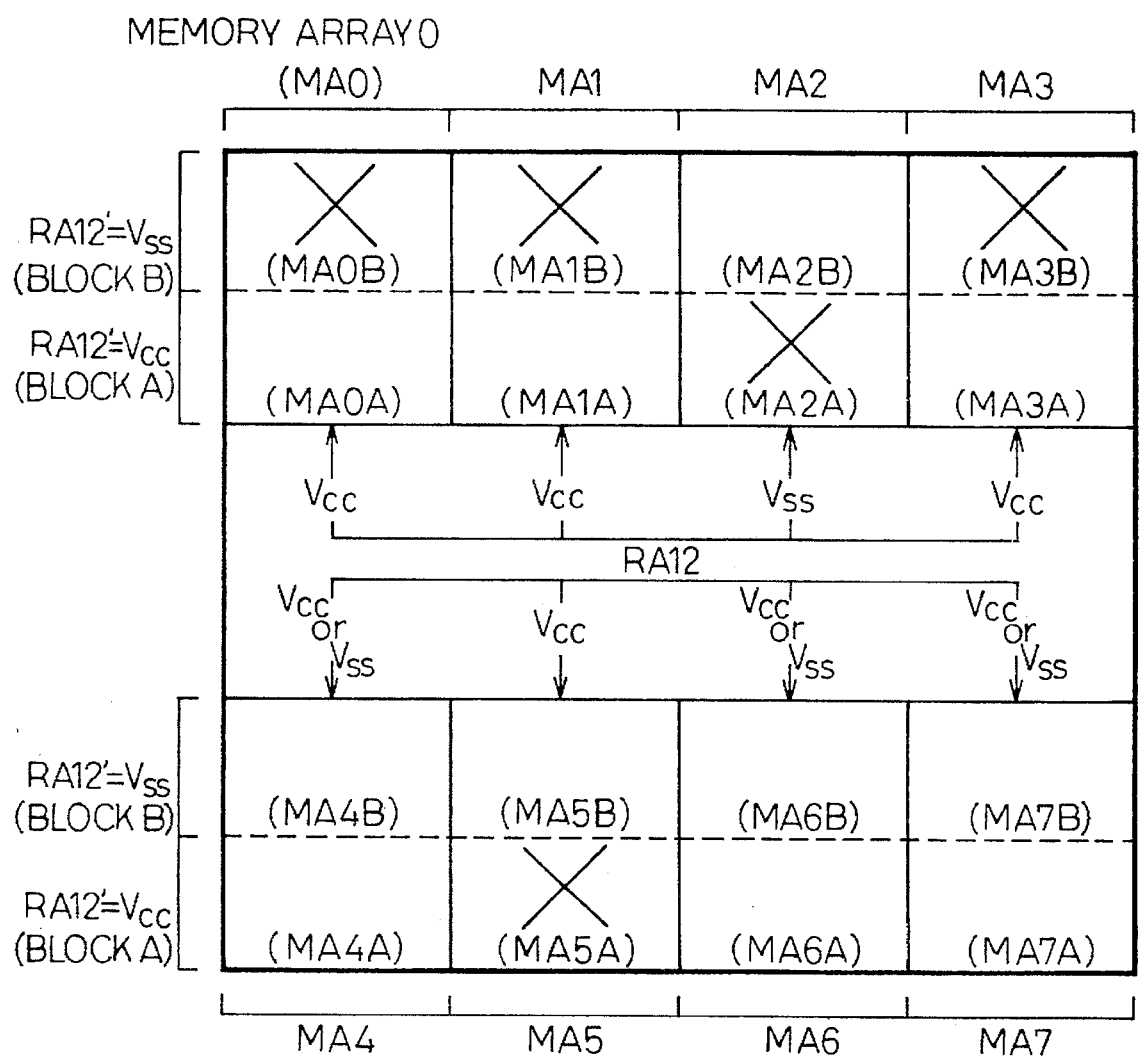
FIG. 4 is a block diagram showing an example of a memory cell portion having some defective memory blocks in a semiconductor memory according to the present invention.

FIG. 4 shows an example of a memory cell portion having some defective memory blocks in a semiconductor memory according to the present invention. Note that the defective memory blocks of the memory cell portion 10' correspond to those shown in FIG. 2.

Namely, the memory cell portion 10' is constituted by a plurality of memory arrays MA0 to MA7, and each memory array (MA0 to MA7) includes two blocks A and B (MA0A to MA7A and MA0B to MA7B). In the memory cell portion 10' shown in FIG. 4, some memory blocks MA0B, MA1B, MA2A, MA3B, and MA5A are defective, wherein at least one of the two blocks (A, B) in each memory array (MA0 to MA7) can be accessed (complete or normal).

As described above with reference to FIG. 3A, in each memory array MA0 to MA7, the memory blocks MA0A to MA7A or MA0B to MA7B can be independently selected by controlling a level of the signal (address signal) RA12 (RA12'). Namely, as shown in FIG. 4, in each memory array MA2 and MA5 where the block A (memory blocks MA2A and MA5A) is defective, a level of the signal RA12 (RA12') for each memory array MA2 and MA5 is brought to the low potential power supply voltage Vss to select the complete (or normal) block B (memory blocks MA2B and MA5B). Conversely, in each memory array MA0, MA1, and MA3 where the block B (memory blocks MA0B, MA1B, and MA3B) is defective, a level of the signal RA12 (RA12') for each memory array MA0, MA1, and MA3 is brought to the high potential power supply voltage Vcc to select the complete block A (memory blocks MA0A, MA1A, and MA3A). Note that, in each memory array MA4, MA6, and MA7 where both blocks A and B (memory blocks MA4A, MA4B; MA6A, MA6B; and MA7A, MA7B) are complete, a level of the signal RA12' (RA12) for each memory array MA4, MA6, and MA7 can be independently brought to the low potential power supply voltage Vss to select the complete block B (memory blocks MA4B, MA6B, and MA7B) or to the high potential power supply voltage Vcc to select the complete block a (memory blocks MA4A, MA6A, and MA7A).

Figures 5A, 5B:
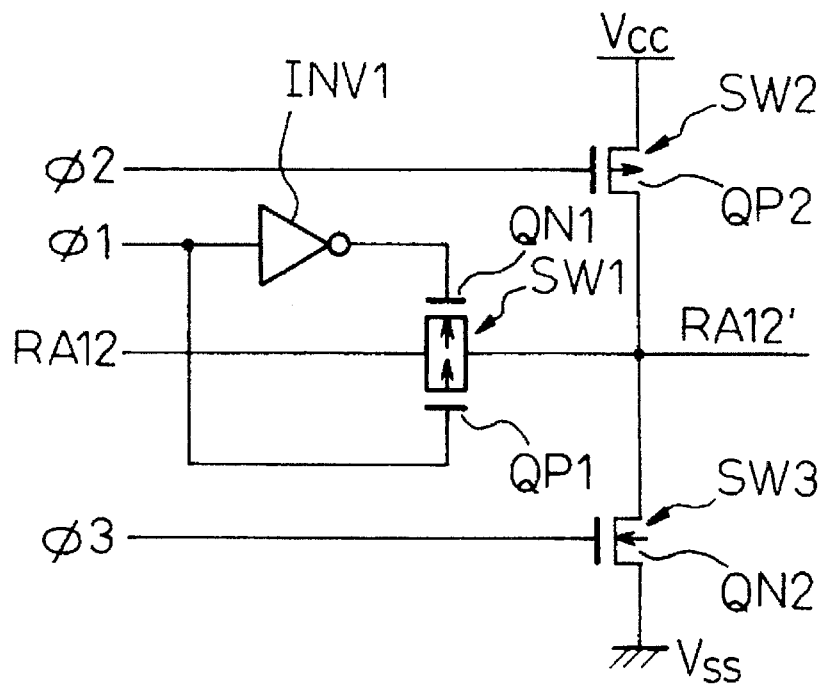
FIG. 5A is a circuit diagram showing an embodiment of a selection circuit provided in a semiconductor memory according to the present invention.
FIG. 5B is a diagram showing signal levels applied to nodes of the selection circuit shown in FIG. 5A.

FIG. 5A shows an embodiment of a selection circuit provided in a semiconductor memory according to the present invention, and FIG. 5B shows signal levels applied to nodes of the selection circuit shown in FIG. 5A.

By comparing the semiconductor memory having the selection circuit shown in FIG. 3A (FIG. 3B) with the selection circuit shown in FIG. 5A, all of the switching units SW1 to SW3 are constituted by transistors (MOS transistors) which are controlled by specific signals (control signals $\phi 1$, $\phi 2$, $\phi 3$). Namely, as shown in FIG. 5A, the switching unit SW1 is constituted by a P-channel type MOS transistor QP1 and an N-channel type MOS transistor QN1, the switching unit SW2 is constituted by a P-channel type MOS transistor QP1, and the switching unit SW3 is constituted by an N-channel type MOS transistor QN2.

The control signal $\phi 1$ is directly supplied to a gate electrode of the transistor QP1 and is also supplied to a gate electrode of the transistor QN1 through an inverter INV1. The control signal $\phi 2$ is supplied to a gate electrode of the transistor QP2, and the control signal $\phi 3$ is supplied to a gate electrode of the transistor QN2. As shown in FIG. 5A, the high potential power supply voltage Vcc is applied to a source electrode of the transistor QP2, and the low potential power supply voltage Vss is applied to a source electrode of the transistor QN2.

The switching operations of the switching units SW1 to SW3 of the selection circuit of FIG. 5A are shown in FIG. 5B.

First, in a normal state, a level of the control signal (first control signal) $\phi 1$ is brought to the low potential power supply voltage Vss, a level of the control signal (second control signal) $\phi 2$ is brought to the high potential power supply voltage Vcc, and a level of the control signal (third control signal) $\phi 3$ is brought to the low potential power supply voltage Vss. Therefore, the transistors QN1 and QP1 are switched ON, the transistor QP2 is switched OFF, and the transistor QN2 is switched OFF, that is, the first switching unit SW1 is switched ON (closed), and the second and third switching units SW2 and SW3 are switched OFF (opened). In this case, a level of the signal (address signal) RA12', which is an output of the selection circuit, is changed in accordance with the signal (address signal) RA12.

Note that, the selection circuit is set to the above normal state, and a testing operation for detecting defective memory cells in the memory cell portion is carried out, before constituting (modifying the semiconductor memory as a complete memory or a half good memory. Further, it is determined whether the semiconductor memory should be modified as a half good memory in accordance with the testing data obtained by the above testing operation.

Next, when disabling the block B and enabling (or selecting) the block A, the level of the signal RA12' should be determined to be the high potential power supply voltage Vcc. Namely, when selecting the block A to modify the semiconductor memory as a half good memory, a level of the first control signal $\phi 1$ is brought to the high potential power supply voltage Vcc, a level of the second control signal $\phi 2$ is brought to the low potential power supply voltage Vss, and a level of the third control signal $\phi 3$ is brought to the low potential power supply voltage Vss. Therefore, the transistors QN1 and QP1 are switched OFF, the transistor QP2 is switched ON, and the transistor QN2 is switched OFF, that is, the first and third switching units SW1 and SW3 are switched OFF (opened), and the second switching unit SW2 is switched ON (closed). In this case, a level of the signal RA12' is determined to be the high potential power supply voltage Vcc, so that the block A (for example, memory block MA0A, MA1A, or MA3A) is selected in each memory array (for example, memory array MA0, MA1, or MA3).

On the other hand, when disabling the block A and enabling (or selecting) the block B, a level of the signal RA12' should be determined to be the low potential power supply voltage Vss. Namely, when selecting the block B to modify the semiconductor memory as a half good memory, a level of the first control signal $\phi 1$ is brought to the high potential power supply voltage Vcc, a level of the second control signal $\phi 2$ is brought to the high potential power supply voltage Vcc, and a level of the third control signal $\phi 3$ is brought to the high potential power supply voltage Vcc. Therefore, the transistors QN1 and QP1 are switched OFF, the transistor QP2 is switched OFF, and the transistor QN2 is switched ON, that is, the first and second switching units SW1 and SW2 are switched OFF (opened), and the third switching unit SW3 is switched ON (closed). In this case, a level of the signal RA12' is determined to be the low potential power supply voltage Vss, so that the block B (for example, memory block MA2B or MA5B) is selected in each memory array (for example, memory array MA2 or MA5).

Note that, in each memory array where both blocks A and B are complete (normal: for example, memory array MA4, MA6, or MA7), where both blocks A and B (memory blocks MA4A, MA4B; MA6A, MA6B; and MA7A, MA7B) are complete, a level of the signal RA12' (RA12) for each memory array MA4, MA6, and MA7 can be independently brought to one of the low potential power supply voltage Vss and the high potential power supply voltage Vcc. In this case, when a level of the signal RA12' is determined to be the low potential power supply voltage Vss, the block A (memory block MA4A, MA6A, or MA7A) is disabled and the block B (memory block MA4B, MA6B, or MA7B) is selected, conversely, when a level of the signal RA12' is determined to be the high potential power supply voltage Vcc, the block B (memory block MA4B, MA6B, or MA7B) is disabled and the block A (memory block MA4A, MA6A, or MA7A) is selected.

Figure 6A:
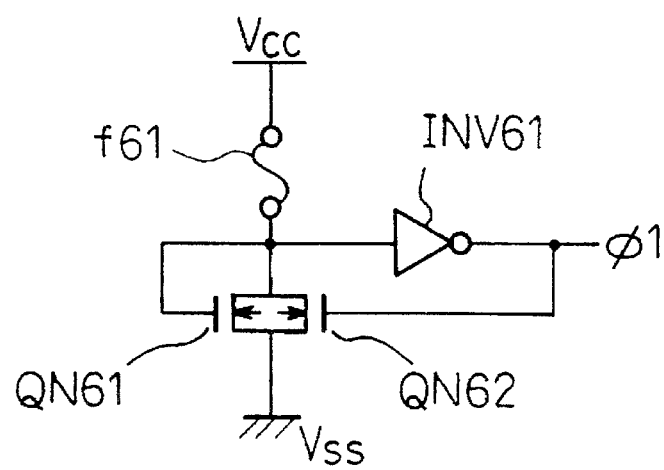
FIGS. 6A to 6C are examples of circuit diagrams showing signal generation circuits for outputting signals used in the selection circuit shown in FIG. 5A.
Figure 6B:
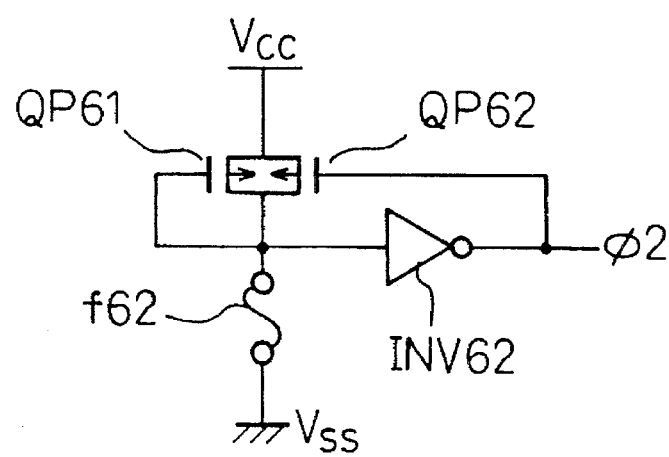
Figure 6C:
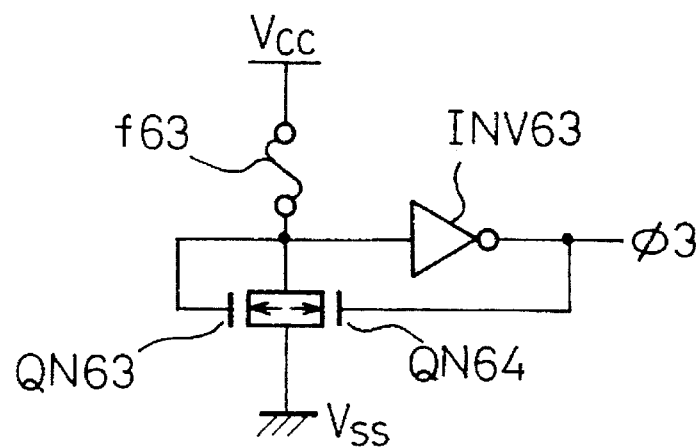

FIGS. 6A to 6C show examples of signal generation circuits for outputting signals (control signals $\phi 1$, $\phi 2$, $\phi 3$) used in the selection circuit shown in FIG. 5A.

As shown in FIG. 6A, the first control signal $\phi 1$ is generated by a signal generation circuit having N-channel MOS transistors QN61 and QN62, an inverter INV61, and a fuse f61, and when the semiconductor memory should is modified as a half good memory, the fuse f61 is cut. Namely, when all memory cells of the semiconductor memory are complete or when all defective memory cells are replaced by the redundant memory cells, the fuse f61 is not cut, and a level of the first control signals $\phi 1$ is determined to be the low potential power supply voltage Vss. Note that a resistance value between source and drain electrodes of the switched ON transistor QN61 (ON-resistance of the transistor QN61) is determined to be large, so that a small passing current flows through the transistor QN61, when the fuse f61 is not cut.

When modifying the semiconductor memory as a half good memory, the fuse f61 is cut, and a level of the first control signals $\phi 1$ is determined to be the high potential power supply voltage Vcc. Namely, when the fuse f61 is cut, a potential at an input of the inverter INV61 is dropped, and a level of the input of the inverter INV61 is brought to the low potential power supply voltage Vss, so that a level of the first control signals φ1 is determined to be the high potential power supply voltage Vcc.

Further, in each memory array (for example, memory array MA0, MA1, or MA3), when selecting (enabling) a block A (for example, memory block MA0A, MA1A, or MA3A), the second control signal φ2 is determined to be the low potential power supply voltage Vss, and further, the third control signal φ3 is also determined to be the low potential power supply voltage Vss. Namely, when selecting the block A in each memory array, the fuses f61 and f62 are cut, and the fuse f63 is not cut. Note that an ON-resistance of the transistor QN63 is determined to be large, so that a small passing current flows through the transistor QN63 when the fuse f63 is not cut.

On the other hand, in each memory array (for example, memory array MA2 or MA5), when selecting a block B (for example memory block MA2B or MA5B), the second control signal φ2 is determined to be the high potential power supply voltage Vcc, and further, the third control signal φ3 is also determined to be the high potential power supply voltage Vcc. Namely, when selecting the block B in each memory array, the fuses f61 and f63 are cut, and the fuse f62 is not cut. Note that an ON-resistance of the transistor QP61 is determined to be large, so that a small passing current flows through the transistor QP61, when the fuse f62 is not cut.

In the above signal generation circuits shown in FIGS. 6A to 6C, a resistance value between the source and drain electrodes of each of the switched ON transistors QN62, QP62, and QN64 (ON-resistances of the transistor QN62, QP62, and QN64) is determined to be small, so that a relative large current flows through each of the transistors, QN62, QP62, and QN64, when each of the fuses f61, f62, and f63 is not cut.

Figures 7A, 7B:
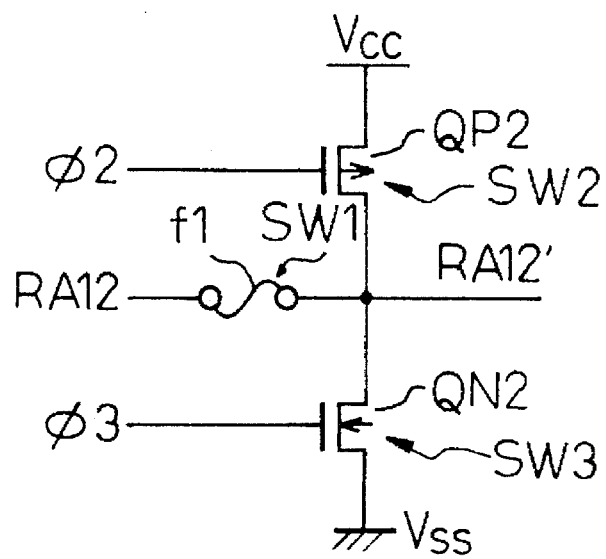
FIG. 7A is a circuit diagram showing another embodiment of a selection circuit provided in a semiconductor memory according to the present invention.
FIG. 7B is a diagram showing melting states of a fuse and signal levels applied to nodes of the selection circuit shown in FIG. 7A.

FIG. 7A shows another embodiment of a selection circuit provided in a semiconductor memory according to the present invention, and FIG. 7B shows melting states of a fuse and signal levels applied to nodes of the selection circuit shown in FIG. 7A.

By comparing FIG. 7A with FIG. 5A, in the embodiment of the selecting circuit shown in FIG. 7A, the transistors QN1 and QP1 and the inverter INV1 of the selection circuit shown in FIG. 5A are replaced by a fuse f1. Further, in the selection circuit of FIG. 7A, the first control signal φ1 required for the selection circuit of FIG. 5A can be omitted. Note that the other configurations of the selection circuit of FIG. 7A are the same as that of FIG. 5A.

By comparing FIG. 7B with FIG. 5B, in the embodiment of the selection circuit shown in FIG. 7A, the fuse f1 is not cut in a normal state. On the other hand, when the semiconductor memory should be modified as a half good memory, the fuse f1 is cut. Namely, the switching operation of the transistors QN1 and QP1 of the selection circuit shown in FIG. 5A corresponds to the cutting state of the fuse f1 of the selection circuit shown in FIG. 7A.

As explained above, the present invention provides a semiconductor memory able to increase the number of partial good memories (half good memories), and to increase the product yield (including the partial good memories).

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory selectively enabled for operation as a complete operative memory or a partial operative memory, comprising:
   a plurality of memory arrays, each memory array comprising a plurality of memory blocks; and
   a plurality of selection circuits respectively associated with said plurality of memory arrays, selectively and independently disabling a defective memory block and selecting a normal memory block of a memory array for enabling operation thereof as a partial operative memory.

2. A semiconductor memory as claimed in claim 1, wherein each of said selection circuits is associated with a respective one of said memory arrays.

3. A semiconductor memory as claimed in claim 1, wherein each of said selection circuits is associated with a respective set of two adjacent said memory arrays.

4. A semiconductor memory as claimed in claim 1, wherein each of said memory arrays comprises a first memory block and a second memory block, and said respective selection circuit disables said first memory block and selects said second memory block, when said first memory block is defective and said second memory block is normal.

5. A semiconductor memory as claimed in claim 1, wherein each memory block, in said respective memory array, comprises a plurality of word lines, a plurality of bit lines, and a plurality of memory cells, each memory cell provided at a corresponding crossing portion of a respective said word line and a respective said bit line, and said plurality of word lines of said plurality of memory blocks of a common memory array are the same.

6. A semiconductor memory as claimed in claim 1, wherein each said selection circuit disables a defective memory block and selects a normal memory block in accordance with specific signals.

7. A semiconductor memory as claimed in claim 1, wherein each of said selection circuits comprises:
   a first switching unit selectively enabling as associated memory array as a complete operative memory or as a partial operative memory;
   a second switching unit selecting a first memory block in said associated memory array in accordance with a second control signal, when modifying said associated memory array to a partial operative memory; and
   a third switching unit selecting a second, different memory block in said associated memory array in accordance with a third control signal, when modifying said associated memory array to a partial operative memory.

8. A semiconductor memory as claimed in claim 7, wherein said first switching unit disables a specific address signal in accordance with a first control signal, and an output of said selection circuit is determined in accordance with respective switching states of said second and third switching units.

9. A semiconductor memory as claimed in claim 7, wherein said first switching unit comprises a fuse and the specific address signal is disabled by melting said fuse, and an output of said selection circuit is determined in accordance with respective switching states of said second and third switching units.

10. A semiconductor memory selectively enabled for operation as a complete operative memory or a half operative memory, comprising:
   a plurality of memory arrays, each memory array comprising a first memory block and a second memory block; and a plurality of selection circuits respectively associated with said plurality of memory arrays, selectively and independently disabling said first memory block and selecting said second memory block, when said first memory block is defective and said second memory block is normal.

11. A semiconductor memory as claimed in claim 10, wherein each of said selection circuits is associated with a respective one of said memory arrays.

12. A semiconductor memory as claimed in claim 10, wherein each of said selection circuits is associated with a respective set of two adjacent said memory arrays.

13. A semiconductor memory as claimed in claim 10, wherein each of said first and second memory blocks comprises a plurality of word lines, a plurality of bit lines, and a plurality of memory cells, each memory cell is provided at a corresponding crossing portion of a respective said word line and a respective said bit line, and said plurality of word lines of said first memory block and said second memory block of a common memory array are the same.

14. A semiconductor memory as claimed in claim 10, wherein said selection circuit disables said defective, first memory block and selects said normal, second memory block in accordance with specific signals.

15. A semiconductor memory as claimed in claim 10, wherein each of said selection circuits comprises:

a first switching unit selectively enabling an associated memory array as a complete operative memory or as a partial operative memory;

a second switching unit selecting a first memory block in said associated memory array in accordance with a second control signal, when modifying said associated memory array to a partial operative memory; and a third switching unit selecting a second, different memory block in said associated memory array in accordance with a third control signal, when modifying said associated memory array as the partial operative memory.

16. A semiconductor memory as claimed in claim 15, wherein said first switching unit disables a specific address signal in accordance with a first control signal, and an output of said selection circuit is determined in accordance with respective switching states of said second and third switching units.

17. A semiconductor memory as claimed in claim 15, wherein said first switching unit comprises a fuse and the specific address signal is disabled by melting said fuse, and an output of said selection circuit is determined in accordance with respective switching states of said second and third switching units.

* * * * *